(12) United States Patent
Froment et al.

(10) Patent No.: US 8,494,475 B2
(45) Date of Patent: Jul. 23, 2013

(54) DIRECT MIXER WITH TRANSISTOR AND SAMPLE-AND-HOLD MODULE

(75) Inventors: Laura Froment, Brive (FR); Christian Poumier, Sarrazac (FR)

(73) Assignee: Thales, Neuilly-sur-Seine (FR)

( * ) Notice: Subject to any disclaimer, the term of this patent is extended or adjusted under 35 U.S.C. 154(b) by 32 days.

(21) Appl. No.: 13/143,926

(22) PCT Filed: Dec. 15, 2009

(86) PCT No.: PCT/EP2009/067192
§ 371 (c)(1),
(2), (4) Date: Feb. 29, 2012

(87) PCT Pub. No.: WO2010/069956
PCT Pub. Date: Jun. 24, 2010

(65) Prior Publication Data
US 2012/0264364 A1    Oct. 18, 2012

(30) Foreign Application Priority Data

Dec. 16, 2008    (FR) ..................... 08 07066

(51) Int. Cl.
*H04B 1/28* (2006.01)
(52) U.S. Cl.
USPC ........................................ 455/333
(58) Field of Classification Search
USPC ............... 455/333, 1, 209, 232, 252.1, 255, 455/266, 274, 280, 293, 323, 326, 359; 332/103
See application file for complete search history.

(56) References Cited

U.S. PATENT DOCUMENTS

| 6,230,000 | B1  | 5/2001  | Tayloe |
| 7,463,108 | B2* | 12/2008 | Horng et al. ................. 332/103 |
| 2007/0218850 | A1 | 9/2007 | Pan |

FOREIGN PATENT DOCUMENTS

EP    1926208 A1    5/2008

* cited by examiner

*Primary Examiner* — Shaima Q Aminzay
(74) *Attorney, Agent, or Firm* — Baker Hostetler LLP

(57) ABSTRACT

A direct mixer includes a transistor and sample-and-hold module and uses a transposition of an RF signal into baseband with a configuration with high dynamic range and low noise factor.

7 Claims, 1 Drawing Sheet

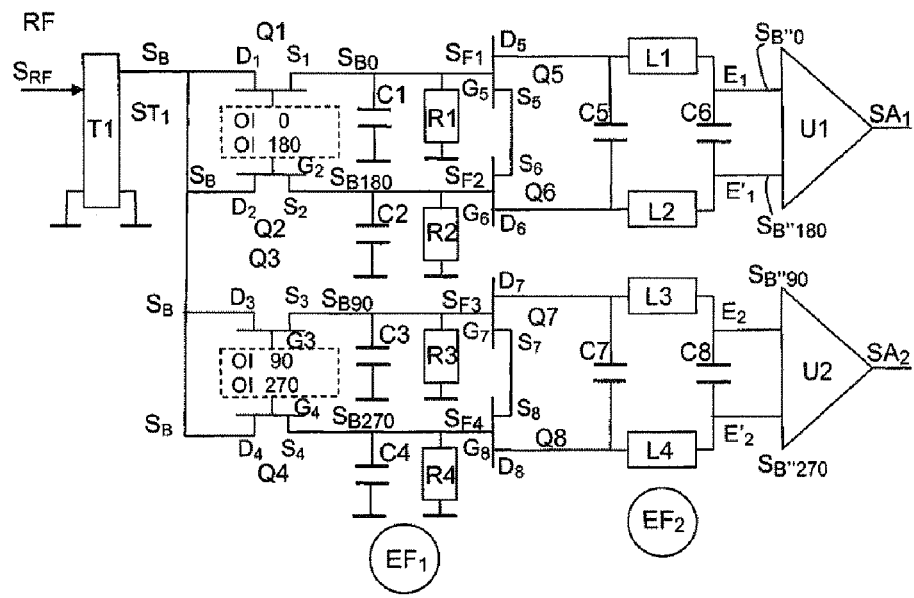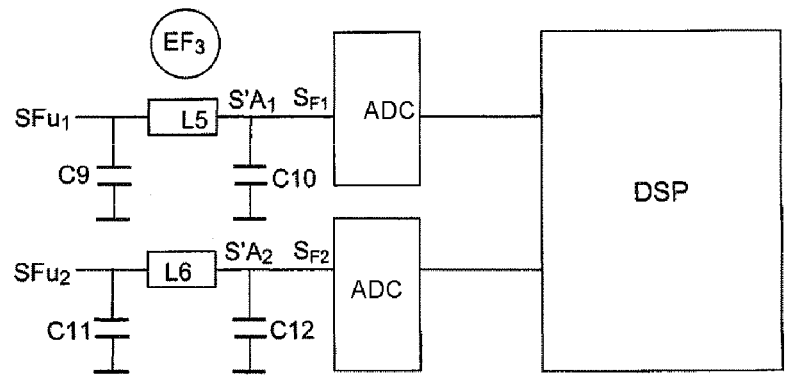

DIRECT MIXER WITH TRANSISTOR AND SAMPLE-AND-HOLD MODULE

CROSS-REFERENCE TO RELATED APPLICATIONS

This application is a National Stage of International patent application PCT/EP2009/067192, filed on Dec. 15, 2009, which claims priority to foreign French patent application No. FR 08 07066, filed on Dec. 16, 2008, the disclosures of which are incorporated by reference in their entirety.

FIELD OF THE INVENTION

The object of the present invention relates to a direct mixer with transistor and sample-and-hold module, the device allowing for the baseband transposition of a radiofrequency RF band signal.

It is used, for example, in analog radio which demands a direct demodulation with a sample-and-hold module.

It applies notably to devices with high dynamic range, that is to say, for signals for which the value of the ratio between the output signal of the device and the signal at the input of the device is high. The dynamic range lies, for example, between 3 dBm for the strongest signal and −160 dBm for the weakest in 1 Hz of bandwidth. The gain of the mixing device and of the interface developed according to the invention is of the order of 40 dB. This makes it possible to compensate for the noise factor of the analog-digital converters present at the output of the device.

The invention applies, for example, to receivers that receive analog signals requiring a very high operating dynamic range in the concurrent presence of two signals, the useful signal at the sensitivity limit of the receiver (that is to say that the receiver manages to perceive it despite its low amplitude, for example), the other being a spurious signal having a high level and capable of making the low-amplitude signal invisible, the spurious signal being known by the term "jamming signal" relative to the useful signal.

The invention relates notably to radio navigation and radio communication receivers.

Hereinafter in the description, the word "jamming" is used for signals which disturb the received signal and which hamper, or even prevent, access to the useful signal. The level of the jamming signal may be greater than 3 dBm.

BACKGROUND OF THE INVENTION

In the abovementioned technical domain, among the problems generally encountered, the best known are the linearity and the noise factor in a direct mixing device. At the present time, it is also desirable to have a simplification of the overall architecture of a receiver.

The prior art describes various devices that seek to resolve these problems. For example, the patent U.S. Pat. No. 6,230,000 describes a switching mixer. While it does prove efficient, this device sometimes does not manage to ensure a good reception of the signals for applications with high dynamic range, a value being able to be defined as follows: >3 dBm for the strong signal and −127 dBm for the weak signal in 5 kHz of bandwidth and offers a linearity which proves insufficient for certain applications, notably, for uses in environments where there are jamming factors. Thus, the device described in this patent U.S. Pat. No. 6,230,000 limits the bandwidth to 100 KHz, with a noise factor of 12 dB and an operating frequency limited to 100 MHz.

Also known are numerous mixer architectures. These do not generally have a dynamic level that is sufficient for applications with high dynamic range.

SUMMARY OF THE INVENTION

The object of the present invention relates to a system and a method relying on a baseband transposition of an RF signal with a high dynamic range configuration, low noise factor and provided with good sensitivity.

The object of the invention relates to a direct mixer with transistor and sample-and-hold module to signals with high dynamic range, characterized in that it comprises, in combination at least with the following elements:

a device T1 designed to transpose a radiofrequency signal into baseband, said radiofrequency signal RF consisting of a useful signal Su and jamming signals, the output ST1 of the transposition device is linked to four transistors Q1, Q2, Q3, Q4 at the level of the drain D1, D2, D3, D4, the gate G1, G2, G3, G4 of each of the transistors is linked to a source S1, S2, S3 and S4 delivering a substantially identical oscillator frequency to each transistor with different phases distributed as follows: phase shift 0° on the gate of the first transistor Q1, phase shift of 180° on the gate of the second transistor Q2, phase shift of 90° on the gate of the third transistor and phase shift of 270° on the gate of the fourth transistor Q4, the frequency value $F_{OL}$ of the oscillator being close to that of the radiofrequency signal to be transposed, each output S1, S2, S3 and S4 of the transistors Q1, Q2, Q3 and Q4 is linked to a first filtering stage EF1 consisting of a number of networks RiCi, having characteristics designed to filter the signal from the output of the transistors, the first filtering stage EF1 has four outputs SF1, SF2, SF3, SF4, each of these outputs is linked to the gate G5, G6, G7, G8 of a transistor Q5, Q6, Q7 and Q8 belonging to a second filtering stage EF2, the transistors are coupled in pairs at the level of their sources S5, S6, S7, S8, a source of a first transistor of a pair being linked to the source of a second transistor, or the output of each transistor Q5, Q6, Q7 and Q8 is loaded with a circuit LiCi (symmetrical pi filter), two outputs of the second filtering stage EF2 whose signals are phase shifted by 180° are linked to the two inputs of a first differential amplifier U1 and a second differential amplifier U2, the output SU1 of the first differential amplifier is linked to a third filtering stage and the output SU2 of the second differential amplifier is linked to the third filtering stage consisting of two LC bridges (pi filter), the two filtered signals are then transmitted respectively to an analog-digital converter $ADC_1$, $ADC_2$.

The signals transmitted to the first differential amplifier and to the second differential amplifier are, for example, distributed as follows: the signal phase-shifted by 0° is transmitted to a first input of a first differential amplifier and the signal phase-shifted by 180° is found on a second input of the same differential amplifier U1, the signal phase-shifted by 90° is linked to a first input of a second differential amplifier U2 and the signal phase-shifted by 270° is linked to a second input of the same differential amplifier.

The characteristics of the RC circuits of the first filtering stage may be designed to obtain a slope of 6 dB per octave.

The characteristics of the components $L_i$, $C_i$ may be designed to obtain a filtering slope of 12 dB per octave.

The characteristics of the components of the LC bridge of the third filtering stage are, for example, designed to obtain a filtering slope of 12 dB per octave.

According to one embodiment, the structure LiCi conforms to a butterworth structure.

The invention can be used for signals having a dynamic range of between 3 dBm for the strongest signal and −160 dBm for the weakest in 1 Hz of bandwidth or, in a bandwidth of 5 KHz, of +3 dBm for the strong signal and −123 dBm for the weak signal.

BRIEF DESCRIPTION OF THE DRAWINGS

Other characteristics and advantages of the device according to the invention will become more apparent from reading the following description of an exemplary embodiment given as an illustration and being in no way limited, with the single FIG. 1 appended which represents an exemplary architecture of a direct mixer with sample-and-hold module according to the invention.

DETAILED DESCRIPTION

The example given to better illustrate the device according to the invention targets signals with a dynamic range of between 3 dBm for the strongest signal and −160 dBm for the weakest in 1 Hz of bandwidth or, in a bandwidth of 5 KHz, of +3 dBm for the strong signal and −123 dBm for the weak signal. These ranges are given solely as an illustration and are in no way limiting in providing a better understanding of the invention.

FIG. 1 of the single plate represents an exemplary architecture of a direct mixer with sample-and-hold module according to the invention.

The radiofrequency signal $S_{RF}$, having a frequency $F_{RF}$, consists of the useful signal Su and possible jamming signals which may hamper its use. This radiofrequency signal RF passes through a frequency transposition device $T_1$ whose notable function is to execute a baseband transposition on the input signal. The transposed signal $S_B$ is then transmitted simultaneously to 4 transistors Q1, Q2, Q3 and Q4 operating as switches. A local oscillator signal with frequency $F_{OL}$ is applied to the gates G1, G2, G3 and G4 of the transistors. Each of the transistors Q1, Q2, Q3 and Q4 is thus subjected to an oscillator frequency that is identical but with different phases. On the first transistor Q1, the phase is 0°, on the second transistor Q2 180°, on the third transistor Q3 90° and on the fourth transistor Q4 270°. Thus, at the output of the transistor Q1, the signal $S_{B0}$ has a phase shift of 0°, this signal corresponds to the RF signal mixed with the signal from the local oscillator $S_{OL}$ phase-shifted by 0°. At the output of Q2, the signal $S_{B180}$ corresponds to the transposed signal SB phase-shifted by 180°. At the output of Q3, the signal obtained corresponds to the transposed basic signal phase-shifted by 90°. At the output of Q4, the signal $S_{B270}$ is phase-shifted by 270° relative to the input signal $S_B$. The frequency value $F_{OL}$ of the local oscillator LO is chosen to be adjacent to or equal to that of the RF signal to be transposed in order for the transposed modulation band to remain in the baseband of the filtering BF produced by the filters detailed below. These phase shifts obtained by injecting a frequency $F_{OL}$ make it possible to retain only the bottom portion of the spectrum of the RF signal.

The output 51, S2, S3 and S4 of each of the transistors, respectively Q1, Q2, Q3 and Q4, is loaded with a network RiCi, denoted R1C1, R2C2, R3C3 and R4C4. The role of this network is notably to charge the capacitor with a voltage resulting from the multiplication between each of the signals from the various filters and the signal $F_{OL}$. This corresponds to the envelope of the resultant signal. The capacitors C1, C2, C3, C4 are charged via the series resistance offered by the transistor when it is conducting and the discharging is done into the resistors R1, R2, R3 and R4 respectively.

The signals $S_{B0}$, $S_{B180}$, $S_{B90}$ and $S_{B270}$ are individually transmitted to a capacitor storage system each consisting of a capacitor C1, C2, C3, C4 connected in parallel with a resistor, respectively R1, R2, R3, R4, each resistor being linked to a ground M. The baseband signal is thus filtered, which constitutes a first filtering level EF1 with a slope, for example, of 6 dB per octave.

The signals from these four filters F1=R1C1, F2=R2C2, F3=R3C3 and F4=R4C4, respectively denoted SF1, SF2, SF3 and SF4, are sent to the gate G5, G6, G7 and G8 of a transistor, respectively to the transistors Q5, Q6, Q7 and Q8. These transistors are linked in pairs as follows: the source S5 of the transistor Q5 is linked to the source S6 of the transistor Q6, the two sources S7 and S8 of the transistors Q7 and Q8 are commoned. This can be seen as a group of two transistors which will be arranged upstream of a second filtering stage EF2 and of the differential amplifiers detailed below.

The operation of the transistors is equivalent to that of switches which conduct when the control voltage Vci applied to the gate G1 of the transistor Qi is greater than the voltage of the source Vsi.

Two transistors Q5, Q6 and Q7, Q8 conduct at the same time in order to obtain a continuous voltage which is identical or substantially identical on the two outputs D5, D6 and D7 and D8, and thus eliminate the residual continuous voltage by the use of a differential amplifier placed after (reducing the common-mode pollutions).

The signals S'F1, S'F2, S'F3 and S'F4 from the transistors Q5, Q6 and Q7, Q8 are transmitted to a second filtering stage EF2 consisting of capacitors $C_i$ and inductors $L_i$ whose characteristic values and arrangement make it possible to have an additional filtering of 12 dB per octave, for example. The filter consisting of the components L1, C5, L2, C6 is, for example, a butterworth-structure filter which makes it possible to limit the group delay time of the filter while offering a good rejection.

At the output of this second filtering stage, the signals phase-shifted by 180° and filtered $S_{B''0}$, $S_{B''180}$, $S_{B''90}$ and $S_{B''270}$ are each transmitted to an input Ei of a differential amplifier U1 and U2. U1 receives on its two inputs E1 and E'1 the filtered and phase-shifted signals $S_{B''0}$, $S_{B''180}$ and U2 receives on its two inputs E2 and E'2 the filtered and phase-shifted signals $S_{B''90}$, $S_{B''270}$. At the output SU1 of U1 and SU2 of U2, the two signals SA1 and SFA2 are phase-shifted by 90°.

The amplified signals SA1 and SA2 are then sent to a third filtering stage EF3 consisting of a bridge which in turn consists of two capacitors connected in parallel and an inductance. This third filtering stage makes it possible to obtain an additional filtering of 12 dB per octave.

The phase shift of 90° between the signals SA1 and SA2 allows for a complex processing of the data forming the signal. The filtered signals S'A1 and S'A2 are then transmitted to an analog-digital converter $ADC_1$, $ADC_2$ before being transmitted to a signal processing device of DSP type for example, DSP standing for Digital Signal Processing.

The invention using a configuration with high dynamic range and low noise factor to transpose the RF signal received on a receiver in baseband notably offers the following advantages:

It makes it possible to overcome the dynamic range limitations of the analog-digital converters by adding filtering stages distributed at various places in the system and an additional amplification in order to limit the impact of the noise factor of the analog-digital converters.

Such a scheme can be used in subharmonic mode. In this case, there is a signal loss as a function of the selected harmonic level.

The prefiltering makes it possible to receive only the harmonic which is required. The configuration according to the invention has a property of receiving a signal in subsampling mode, that is to say that any signal with a subharmonic relationship with the input signal can be transposed into baseband with an attenuation of 20 LOG (of the harmonic rank) relative to the fundamental frequency signal hence the need to precede the configuration with a filter.

The coverage band obtained is very wide. Indeed, the configuration of the invention is limited in frequency only by the stray capacitances and the rise and fall times of the transistors used in switching mode, so there is no limitation toward the low frequencies. The limitation toward the high frequencies applies with the current technologies while having the requisite dynamic range at approximately 600 MHz and close to 2 GHz with a loss of dynamic range of approximately 15 dB over several octaves with prefiltering.

The intermodulation is enhanced relative to the preceding configurations with a gain only in baseband with feedback functions, which gives the configuration a "high linearity".

The invention claimed is:

1. A mixer device with transistor and sample-and-hold module for signals with high dynamic range, comprising: a transposition device T1 designed to transpose a radiofrequency signal into baseband, said radiofrequency signal RF consisting of a useful signal Su and jamming signals, four transistors, Q1, Q2, Q3, and Q4, an output ST1 of the transposition device being linked to the four transistors Q1, Q2, Q3 and Q4 at the level of the drain D1, D2, D3 and D4, the gate G1, G2, G3 and G4 of each of the transistors Q1, Q2, Q3 and Q4 being linked to a source S1, S2, S3 and S4 delivering a substantially identical oscillator frequency to each transistor with different phases distributed as follows: phase shift 0° on the gate of the first transistor Q1, phase shift of 180° on the gate of the second transistor Q2, phase shift of 90° on the gate of the third transistor and phase shift of 270° on the gate of the fourth transistor Q4, the frequency value FoL of the oscillator being close to that of the radiofrequency signal to be transposed, each output S1, S2, S3 and S4 of the transistors Q1, Q2, Q3 and Q4 being linked to a first filtering stage EF1 consisting of a number of networks RiCi, having characteristics designed to filter the signal from the output of the transistors, and a first filtering stage EF1 having four outputs, each of these outputs is linked to the gate G5, G6, G7 and G8 of a transistor Q5, Q6, Q7 and Q8 belonging to a second filtering stage EF2, the transistors being coupled in pairs at the level of their sources S5, S6, S7, S8, a source of a first transistor of a pair being linked to the source of a second transistor, or the output of each transistor Q5, Q6, Q7 and Q8 being loaded with a circuit LiCi, wherein two outputs of the second filtering stage EF2 whose signals are phase-shifted by 180° are linked to the two inputs of a first differential amplifier U1 and a second differential amplifier U2, the output SU1 of the first differential amplifier is linked to a third filtering stage and the output SU2 of the second differential amplifier is linked to the third filtering stage consisting of two LC bridges, and the two filtered signals are then transmitted respectively to an analog-digital converter ADC1, ADC2.

2. The device according to claim 1, wherein the distribution of the signals transmitted to the first differential amplifier and to the second differential amplifier takes the following form: the signal phase-shifted by 0° is linked to a first input of a first differential amplifier and the signal phase-shifted by 180° is linked to a second input of the same first differential amplifier U1, the signal phase-shifted by 90° is linked to a first input of a second differential amplifier U2 and the signal phase-shifted by 270° is linked to a second input of the same second differential amplifier.

3. The device according to claim 1, wherein the characteristics of the RC circuits of the first filtering stage are designed to obtain a slope of 6 dB per octave.

4. The device according to claim 1, wherein the characteristics of the components $L_i$, $C_i$ are designed to obtain a filtering slope of 12 dB per octave.

5. The device according to claim 1, wherein the characteristics of the components of the bridge $L_iC_i$ of the third filtering stage are designed to obtain a filtering slope of 12 dB per octave.

6. The device according to claim 5, wherein the circuit LiCi has a butterworth structure.

7. The device according to claim 1, wherein the signals include a signal with a dynamic range of between 3 dBm for the strongest signal and −160 dBm for the weakest in 1 Hz of bandwidth or, in a bandwidth of 5 KHz, of +3 dBm for the strong signal and −123 dBm for the weak signal.

* * * * *